US011235328B2

(12) United States Patent
Cumbie et al.

(10) Patent No.: US 11,235,328 B2
(45) Date of Patent: Feb. 1, 2022

(54) COPLANAR MICROFLUIDIC MANIPULATION (71) Applicant: Hewlett-Packard Development Company, L.P., Spring, TX (US)

(72) Inventors: Michael W. Cumbie, Corvallis, OR (US); Viktor Shkolnikov, Palo Alto, CA (US); Chien-Hua Chen, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 215 days.

(21) Appl. No.: 16/494,827

(22) PCT Filed: Apr. 21, 2017

(86) PCT No.: PCT/US2017/028808
§ 371 (c)(1),
(2) Date: Sep. 17, 2019

(87) PCT Pub. No.: WO2018/194648
PCT Pub. Date: Oct. 25, 2018

(65) Prior Publication Data
US 2020/0038872 A1 Feb. 6, 2020

(51) Int. Cl.
*B01L 3/00* (2006.01)

(52) U.S. Cl.
CPC ... B01L 3/502792 (2013.01); B01L 3/502707 (2013.01); *B01L 2200/12* (2013.01);
(Continued)

(58) Field of Classification Search
CPC ............ B01L 2200/12; B01L 2200/16; B01L 2300/06; B01L 2300/0645;
(Continued)

(56) References Cited

U.S. PATENT DOCUMENTS 6,548,895 B1 4/2003 Benavides et al.
6,790,011 B1 9/2004 Le Pesant et al.
(Continued)

FOREIGN PATENT DOCUMENTS

CN 1499949 5/2004
CN 103170383 6/2013
(Continued)

OTHER PUBLICATIONS

Brown et al., An Experimental Validation of the Pressure Capacity of a Modular Gasketless Microfluidic Interconnect, 18th International Conference on Miniaturized Systems for Chemistry and Life Sciences, 14CBMS-0001, Oct. 26-30, 2014, pp. 1665-1667.
(Continued)

*Primary Examiner* — Jennifer Wecker
(74) *Attorney, Agent, or Firm* — Thorpe North & Western LLP (57) ABSTRACT

An apparatus includes a polymer base layer having a surface. A die that includes a fluid manipulation surface that is substantially coplanar with the surface of the polymer base layer. The die includes a control electrode to generate an electric field to perform microfluidic manipulation of fluid across the fluid manipulation surface of the die.

14 Claims, 6 Drawing Sheets

(52) U.S. Cl.
CPC ....... *B01L 2200/16* (2013.01); *B01L 2300/06* (2013.01); *B01L 2300/0645* (2013.01); *B01L 2300/0809* (2013.01); *B01L 2300/12* (2013.01); *B01L 2300/16* (2013.01); *B01L 2400/0427* (2013.01)

(58) Field of Classification Search
CPC ..... B01L 2300/0809; B01L 2300/0816; B01L 2300/12; B01L 2300/16; B01L 2400/0427; B01L 3/502707; B01L 3/502792; H01L 21/561; H01L 21/568; H01L 2224/2731; H01L 2224/2919; H01L 2224/32058; H01L 2224/32106; H01L 2224/32225; H01L 2224/32237; H01L 2224/48227; H01L 2224/83002; H01L 2224/83855; H01L 2224/85; H01L 2224/8592; H01L 2224/97; H01L 24/27; H01L 24/29; H01L 24/32; H01L 24/48; H01L 24/83; H01L 24/85; H01L 24/96; H01L 24/97; H01L 25/04; H01L 25/50; H01L 2924/00012; H01L 2924/00014; H01L 2924/15153
See application file for complete search history.

(56) References Cited

U.S. PATENT DOCUMENTS

| | | | |
|---|---|---|---|
| 7,524,464 | B2 | 4/2009 | Ahn et al. |
| 7,547,380 | B2 | 6/2009 | Velev |
| 7,658,829 | B2 | 2/2010 | Kanagasaba et al. |
| 7,682,817 | B2 | 3/2010 | Cohen et al. |
| 7,754,150 | B2 | 7/2010 | Wada et al. |
| 8,021,961 | B2 | 9/2011 | Sparks |
| 8,403,557 | B2 | 3/2013 | Li et al. |
| 9,481,945 | B2 | 1/2016 | Juncket et al. |
| 9,421,544 | B2 | 8/2016 | Wang |
| 2003/0153119 | A1* | 8/2003 | Nathan ................... H01L 21/56 438/106 |
| 2003/0183525 | A1 | 10/2003 | Elrod et al. |
| 2003/0215335 | A1 | 11/2003 | Criveiii |
| 2004/0028566 | A1 | 2/2004 | Ko et al. |
| 2004/0163958 | A1 | 8/2004 | Kao et al. |
| 2005/0196321 | A1 | 9/2005 | Huang |
| 2008/0169197 | A1 | 7/2008 | McRuer et al. |
| 2008/0199362 | A1 | 8/2008 | Chong et al. |
| 2008/0210306 | A1 | 9/2008 | Xie et al. |
| 2009/0326279 | A1 | 12/2009 | Tonkovich et al. |
| 2010/0018584 | A1 | 1/2010 | Bransky et al. |
| 2010/0181195 | A1 | 7/2010 | Garcia Tello |
| 2011/0020141 | A1 | 1/2011 | Van Zon et al. |
| 2011/0220505 | A1 | 9/2011 | Wang et al. |
| 2012/0298233 | A1 | 11/2012 | Rothacher |
| 2013/0118901 | A1 | 5/2013 | Pollack et al. |
| 2013/0121892 | A1 | 5/2013 | Fuhrmann et al. |
| 2013/0206597 | A1* | 8/2013 | Wang ................... B41J 2/14024 204/450 |
| 2014/0051159 | A1 | 2/2014 | Bergstedt et al. |
| 2014/0083858 | A1 | 3/2014 | Teh et al. |
| 2015/0001083 | A1 | 1/2015 | Martin et al. |
| 2015/0306598 | A1 | 10/2015 | Khandros et al. |
| 2016/0296929 | A1 | 10/2016 | Chen et al. |
| 2017/0141278 | A1* | 5/2017 | Hamaguchi ............. H01L 33/62 |
| 2018/0015460 | A1 | 1/2018 | Sells et al. |

FOREIGN PATENT DOCUMENTS

| | | |
|---|---|---|
| CN | 104603595 | 5/2015 |
| CN | 105916689 | 8/2016 |
| DE | 102004011667 | 11/2005 |
| EP | 1643288 | 4/2006 |
| JP | 2003294770 | 10/2003 |
| JP | 2004000935 | 1/2004 |
| JP | 2005292092 | 10/2005 |
| JP | 2010539503 | 12/2010 |
| JP | 2012112724 | 6/2012 |
| JP | 2016153725 | 8/2016 |
| TW | 200534916 | 11/2005 |
| TW | 200911375 | 3/2009 |
| TW | 201525464 | 7/2015 |
| WO | 2005075081 | 8/2005 |
| WO | 2006044966 | 4/2006 |
| WO | 2009004533 | 1/2009 |
| WO | 2012085728 | 6/2012 |
| WO | 2014165373 | 10/2014 |
| WO | 2015019520 | 2/2015 |
| WO | 2016111251 | 7/2016 |
| WO | 2016122554 | 8/2016 |
| WO | 2016122572 | 8/2016 |

OTHER PUBLICATIONS

Le et al., Fabrication of 25 um-filter microfluidic chip on silicon substrate, Advances in Natural Sciences: Nanoscience and Nanotechnology 8/1/015003, 2017, 11 pages.

Jung et al., A novel actuation method of transporting droplets by using electrical charging of droplet in a dielectric fluid, AIP Biomicrofluidics Fundamentals, Perspectives & Applications, 3(2): 022402, 2009, 7 pages.

Zhou et al., One-Step Injection Molding of Oste+Microfluidic Devices With Screw Threaded Ports, 18th International Conference on Miniaturized Systems for Chemistry and Life Sciences, 14CBMS-0001 , Oct. 26-30, 2014, pp. 1671-1673.

Wood et al., Microfabricated high-throughput electronic particle detector, Review of Scientific Instruments 78, 104301, 2007, 6 pages.

Xu et al, A Droplet-Manipulation Method for Achieving High-Throughput in Cross-Referencing-Based Digital Microfluidic Biochips, IEEE Transaction on Computer-Aided Design of Integrated Circuits and Systems, vol. 27, No. 11, Nov. 2008, pp. 1905-1917.

International Search Report dated Jan. 31, 2018 for PCT/US2017/028808, Applicant Hewlett-Packard Development Company, L.P.

Fan et al., Droplet-on-a-wristband: Chip-to-chip digital microfluidic interfaces between replaceable and flexible electrowetting modules, the Royal Society of Chemistry, Lab on a Chip, vol. 11, 2011, pp. 343-347.

* cited by examiner

FIG. 13

COPLANAR MICROFLUIDIC MANIPULATION

BACKGROUND

Fluid processing systems can be constructed in very small packages and are sometimes referred to as lab-on-a-chip. These systems can be based upon micromanipulation of discrete fluid droplets on micro-liter or smaller scales. Thus, micro-fluidic processing can be performed on unit-sized packets of fluid that are then transported, stored, mixed, reacted, and/or analyzed in a discrete manner using a standard set of basic fluid control instructions. These basic fluid control instructions can be combined and reused within hierarchical design structures such that more complex fluid processing procedures (e.g., chemical synthesis or biological assays) can be constructed.

DETAILED DESCRIPTION

A digital microfluidic (DMF) apparatus is provided to enable fluid manipulation of larger droplets that can be exchanged via user-accessible input/output (I/O) ports. Small volumes of the fluid (e.g., droplets) can be routed via channels from the I/O ports to designated manipulation and/or mixing areas of the apparatus. Fluid routing/manipulation can be digitally controlled via integrated dies (e.g., silicon dies with electrode control elements) for more precise pico-liter, nano-liter, and/or micro-liter processing of the fluids. A hybrid construction of the DMF apparatus, which includes electrode-carrying dies disposed in surface of a base layer, allows a less expensive material (compared to all silicon implementations) to provide a base layer for supporting the I/O ports, channels and other microfluidic structures while also providing supporting a number of die in the base layer. Since less silicon can be used in the DMF apparatus, the overall cost can be reduced accordingly.

As a further example, a coplanar construction is provided where the base layer and the die layer are integrated to provide a substantially smooth, coplanar fluid manipulation surface to mitigate impediments to fluid flow across the die. Instead of constructing the base out of silicon as in previous implementations, the base can be constructed of a more inexpensive material (e.g., polymer or copolymer) while providing DMF control via a number of smaller integrated die residing in the base layer. In one example, the base layer supports a die that includes a fluid droplet manipulation surface which is co-planar with a surface of the base layer. The integrated DMF apparatus can be constructed to ensure that the die surface is substantially coplanar with a surface of the base layer. The die includes a control electrode (or electrodes) to generate an electric field to perform manipulation (e.g., mixing/routing) of fluids across the fluid manipulation surface of the die. For instance, the die can also include control circuitry to implement the fluid manipulation via the electrodes.

Figure 1:
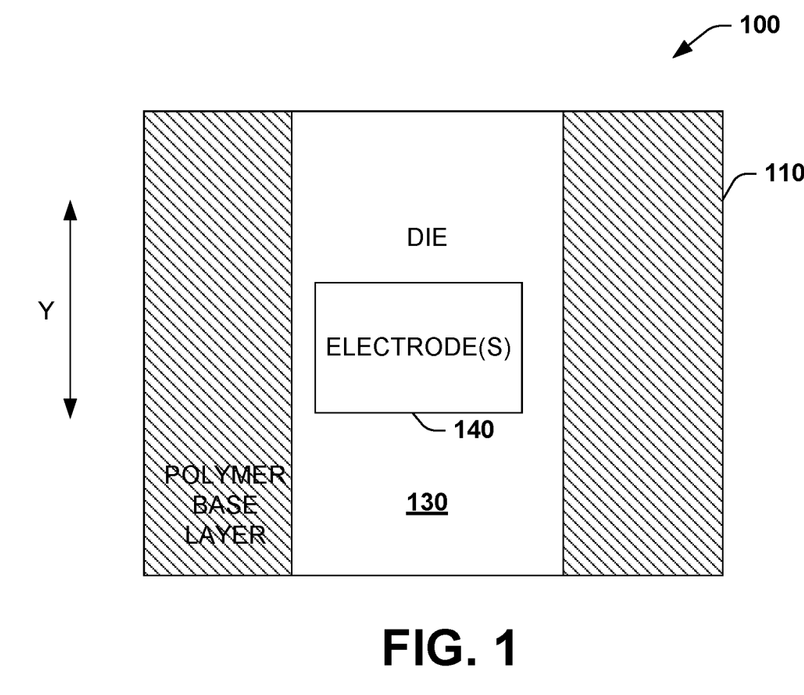
FIG. 1 illustrates a top view of an example apparatus for fluid manipulation.

FIG. 1 illustrates a top view of an example apparatus 100 for fluid droplet manipulation. The apparatus 100 includes a base layer 110 that provides a substrate to support a fluid manipulation assembly (e.g., integrated assembly for routing and/or mixing fluids). The base layer 110 can provide a substrate composed of a single material (e.g., polymer resin) or can provide a substrate assembly of more than one material (e.g., layered materials forming the base layer). In one example, the base layer 110 can be formed as an epoxy molding compound (EMC), such as a thermosetting epoxy polymer resin material (e.g., catalog no. CEL400ZHF40WG from Hitachi, Inc.). An example amount of epoxy molding material to fabricate a base layer to support a 30 mm×30 mm substrate size is about two grams. A die 130 includes side edges that extend longitudinally (Along Y axis) between spaced ends of the die. Each side edge of the die 130 forms a coplanar surface with the polymer base layer 110 that contact each adjacent edge of the polymer base layer.

In one example, the base layer 110 can be molded over the die to form a coplanar surface (see e.g., FIGS. 8-12). In another example, the die 130 can be inserted into a recessed portion of the base layer to form a coplanar surface (see e.g., FIG. 13). The die 130 can include a control electrode 140 which can be electrically connected to receive electrical energy (e.g., from a power supply) and generate an electrical field to perform manipulation of fluid across the fluid manipulation surface of the die. Example fluids that can be manipulated on the fluid manipulation surface of the die can include biological fluids, reagents, chemicals, aqueous solutions, oils, and sample preparation fluids, for example.

As used herein, the term "substantially coplanar" refers to aligning the top surface of the die 130 with the top surface of the base layer 110 such that substantially no impediment to fluid flow occurs at the juncture between the two surfaces and from an interconnect formed between an input/output port and the die. Fabrication processes are described herein with respect to FIGS. 8-13 to provide the coplanar construction. Such coplanar fabrication allows the base layer 110 to be fabricated out of a less expensive material (as opposed to being the same material as the die) while the die 130 which includes fluidic flow controls described herein can have its area minimized to reduce overall assembly costs. As shown, the die 130 includes the control electrode (or electrodes) 140 to control fluid flow across the surface of the die. The control electrode can be used to generate an electric field to perform fluid manipulation across the surface of the die. In addition to control electrodes 140, the die 130 can include other logic such as switches of control devices to control the electrodes. Control devices in some examples can also be implemented in external processing circuits where control signals form such devices are routed via printed circuit board connections which are described below with respect to FIGS. 2-5.

In some examples, at least one other die can be positioned in line with the die in the base layer 110 or positioned at a different angle from the die in the base layer to enable routing of fluids in more than one dimension (e.g., dies are fabricated at right angles to allow fluidic control in multiple dimensions). The die 130 can be formed of silicon but other semiconductor types are possible. Example fabrication processes for achieving coplanar fabrication between dissimilar base layer and die materials are disclosed herein with respect to FIGS. 8-13.

Figure 2:
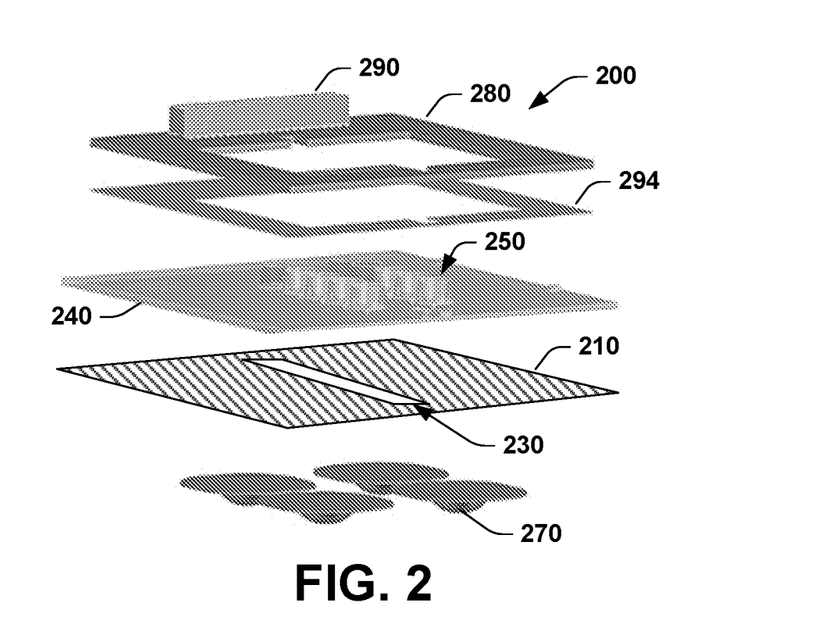
FIG. 2 illustrates a view of layers of to fabricate an example apparatus for fluid manipulation.

The control electrode 140 supports mixing and routing of fluid droplets across the surface of the die 130. Fluid droplets can be formed using the surface tension properties of liquid. For example, water placed on a hydrophobic surface will lower its contact with the surface by creating drops whose contact angle with the substrate can increase as the hydrophobicity increases. However, in some cases it is possible to control the hydrophobicity of the substrate by using electrical fields which are provided by the electrodes 140. This is sometimes referred to as "Electro-wetting On Dielectric" or EWOD (e.g., a hydrophobic layer disposed over a dielectric layer, which is disposed over the co-planar surface of the die and base layer). Such electrode implementations can be referred to as digital micro-fluidic (DMF) applications. FIGS. 2 though 6 below illustrate an example fabrication process to provide a DMF assembly where fluid can be manipulated (e.g., mixed and routed).

FIG. 2 illustrates a view of layers of to fabricate an example apparatus 200 for fluid droplet manipulation. A polymer base layer 210 includes a die (single or multiple) 230. The die 230 includes a fluid manipulation surface that is substantially coplanar with a surface of the base layer 210. The die 230 includes a control electrode (or electrodes) to perform manipulation of fluid across the fluid droplet manipulation surface of the die.

A fluidic transport layer 240 includes a fluidic channel (or channels) fluidly coupled with an input/output (I/O) port 250 and supported by the base layer 210. The I/O port 250 can be spaced apart from the fluid manipulation surface of the die 230. The fluidic channel (not visible but fabricated within transport layer) extends longitudinally across the fluidic transport layer 240 from the die 230 to the I/O port 250. Fluid can be injected (e.g., via pipette dispenser) into the port 250 and travel to the channel for mixing/routing and/or extracted according to interaction with the one or more electrodes of the die 230. As shown, the fluidic transport layer 240 can be mounted on top of the base layer 210 and can provide one or more fluidic channels to couple fluids from one or more I/O ports such as shown at 250 to the fluid droplet manipulation surface of the die 230.

In an example, the fluidic transport layer 240 can be coated with a conductive layer (not shown) to provide a return path for the control electrode to perform manipulation of fluids across the fluid droplet manipulation surface of the die 230. In another example, the fluid transport layer is not coated and all control current paths are routed to the die 230 (e.g., both power and return path electrode for manipulating fluids routed to die). The fluidic transport layer 240 can include a mixing area (see e.g., FIG. 5) to enable premixing of fluids before the fluids are injected into the I/O port 250. The fluidic transport layer 240 can also include a reagent port (see e.g., FIGS. 4 and 5) to receive a reagent fluid to be mixed with the fluids in the mixing area or to be mixed with fluids in the fluidic channel of the fluidic transport layer 240.

A reagent storage package 270 (e.g., blister pack) can be coupled to the base layer 210 to provide the reagent fluid to the reagent port of the fluidic transport layer 240. In another example, the reagent storage package 270 can be coupled to a separate reagent layer before coupling the reagent layer to the base layer 210. The reagent storage package 270 can be pressed by a user to release the reagent fluid for mixing at the fluid transport layer 240 via the reagent port. A printed circuit assembly (PCA) 280 having a connector 290 can be mounted on top of the fluidic transport layer via adhesive 294. The PCA 280 couples the control electrode from the connector 290 to the die 230 via a wire bonding area depicted in FIG. 5B. The fluidic transport layer 240 can be formed in one or more layers of a Cyclic Olefin Polymer (COP) or Cyclic Olefin Copolymer (COC), for example. Other materials can be used in other examples.

Figure 3:
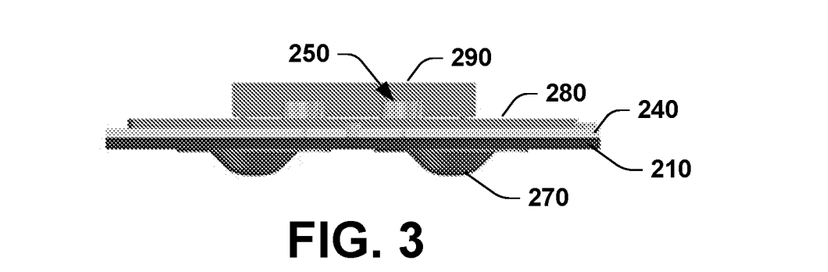
FIG. 3 illustrates a side view of an example apparatus for fluid manipulation.

FIG. 3 illustrates a side view of the example apparatus depicted in FIG. 2 for fluid droplet manipulation. This view shows the layers depicted in FIG. 2 after they have been fabricated into a single fluid manipulation assembly. As shown, the reagent storage package 270 is coupled to a surface of the base layer 210 that is opposite the fluid manipulation surface thereof. The fluidic transport layer 240 is mounted on the base layer 210. The printed circuit assembly (PCA) 280 having a connector 290 is mounted on top of the fluidic transport layer 240. Input/output (I/O) port 250 of the fluidic transport layer 240 is shown appearing through an opening of the PCA 280 (shown as reference numeral 244 in FIG. 4).

Figure 4:
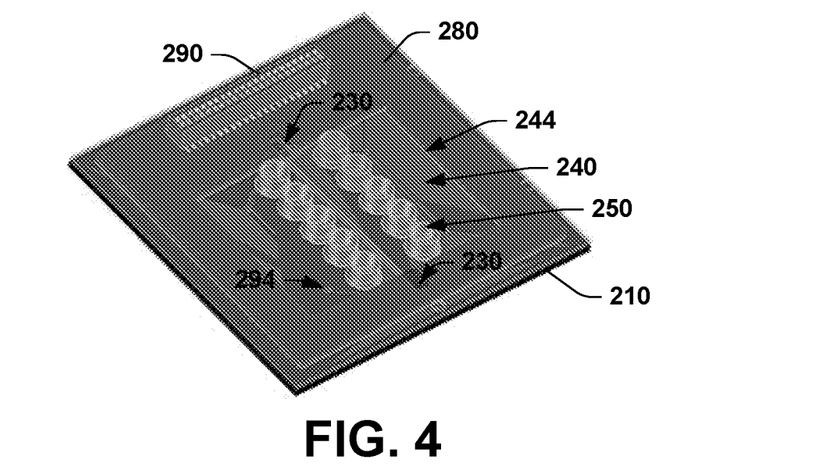
FIG. 4 illustrates a top view of an example apparatus for fluid manipulation.
Figures 5A, 5B:
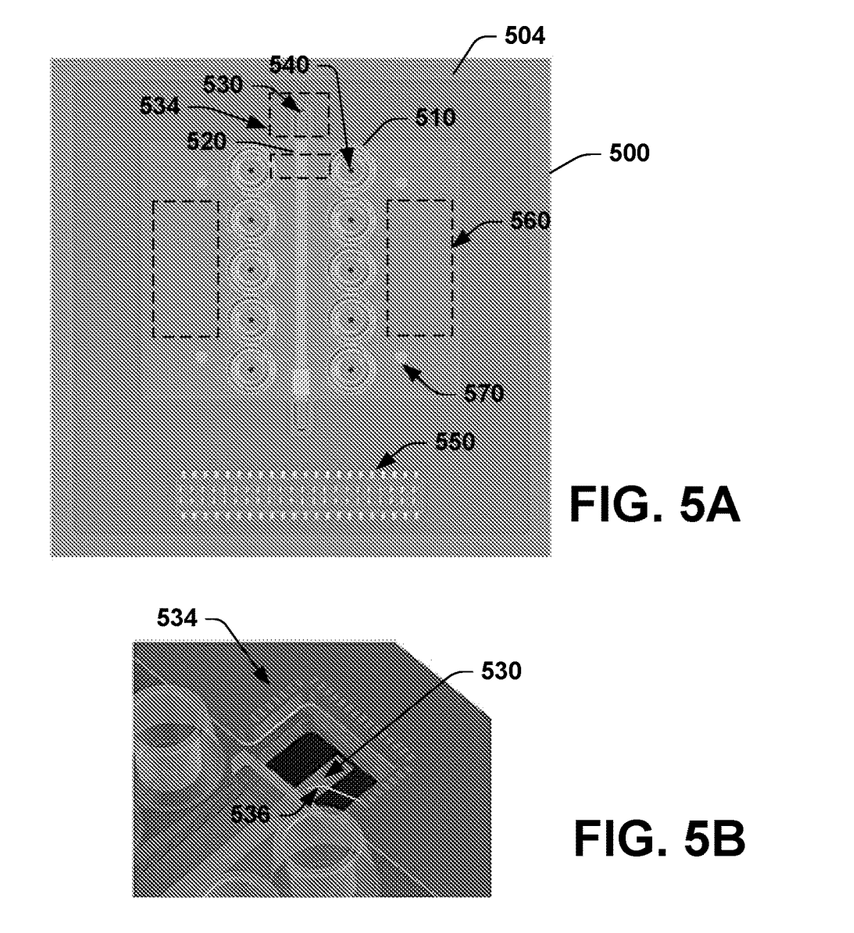
FIG. 5A illustrates a top view of an example fluidic transport layer for fluid manipulation.
FIG. 5B illustrates a magnified view of a wire bonding area between a die and a printed circuit assembly depicted in FIG. 5A.

FIG. 4 illustrates a top view of an example apparatus for fluid droplet manipulation. This view shows the top view of the apparatus depicted in FIGS. 2 and 3. In this view, the connector 290 is mounted on PCA 280. An opening 244 in the PCA 280 allows access to I/O port 250 of the fluidic transport layer 240. In this example, ten I/O ports are shown but more or less than ten ports can be provided. The base layer 210 provides support for the overall assembly. A die (or dies) 230 can be mounted in the base layer 210 and connected through the PCA 280 to the connector 290. A reagent portal 294 in the fluidic transport layer 240 is provided to allow reagent fluid to be injected from the reagent storage package (not visible in this view) through the base layer 210 to the mixing area and/or fluidic channels of the fluidic transport layer that are described below with respect to FIG. 5A.

FIG. 5A illustrates a top view of an example fluidic transport layer 500 and printed circuit assembly (PCA) 504 for fluid droplet manipulation. One or more I/O ports 510 can be provided to allow users to insert or extract fluids to a fluidic channel 520 providing access to a die 530. A wire bonding area 534 for connecting the PCA 504 to the die 530 can provided, where a magnified view of the wire bonding area is depicted in FIG. 5B. An opening 540 at the bottom of the I/O port 510 provides access to the fluidic channel 520. Connections 550 in the PCA 504 can be provided for mounting a connector as described herein (not shown in this view). The fluidic transport layer 500 can include a mixing area 560 to enable premixing of fluids before the fluids are injected into the I/O port 540 (e.g., provide a macro mixing area for fluid before it is injected into the I/O port). The fluidic transport layer 500 can also include a reagent port 570 (or ports) to receive a reagent fluid to be mixed with the fluids in the mixing area 560 or to be mixed with fluids in the fluidic channel 520 of the fluidic transport layer 500. The I/O port 520 can be spaced apart from the fluid droplet manipulation surface of the die 530. The fluidic channel 520 extends longitudinally across the fluidic transport layer from the die 530 to the I/O port 520. As shown, other ports (or port pairs and channels) can be spaced in parallel to the port 510 along the surface of the fluidic transport layer 500.

FIG. 5B illustrates a magnified view of the wire bonding area 534 of FIG. 5A where connections can be made between the die 530 and the printed circuit assembly 504 depicted in FIG. 5A. An example wire 536 is shown connecting the PCA 504 to the die 530. The wire bonding assembly can occur after the various layers described herein have been constructed to form a microfluidic assembly. A polymer cap (not shown) can be placed over the wire bonding area 534 to seal the area after the wires have been bonded.

Figure 6:
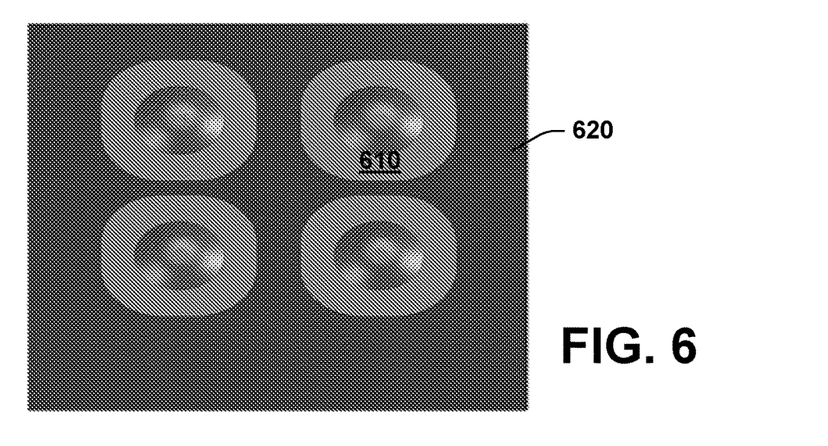
FIG. 6 illustrates a bottom view of a reagent packs that are coupled to a base layer for fluid manipulation.

FIG. 6 illustrates a bottom view of reagent storage package (or packages) 610 that are coupled to a base layer 620 for fluid droplet manipulation. The storage packages can be ruptured by user pressure to inject reagent fluids to the channels and/or mixing areas of the fluidic transport area such as via the reagent port 570 described above with respect to FIG. 5A.

Figure 7:
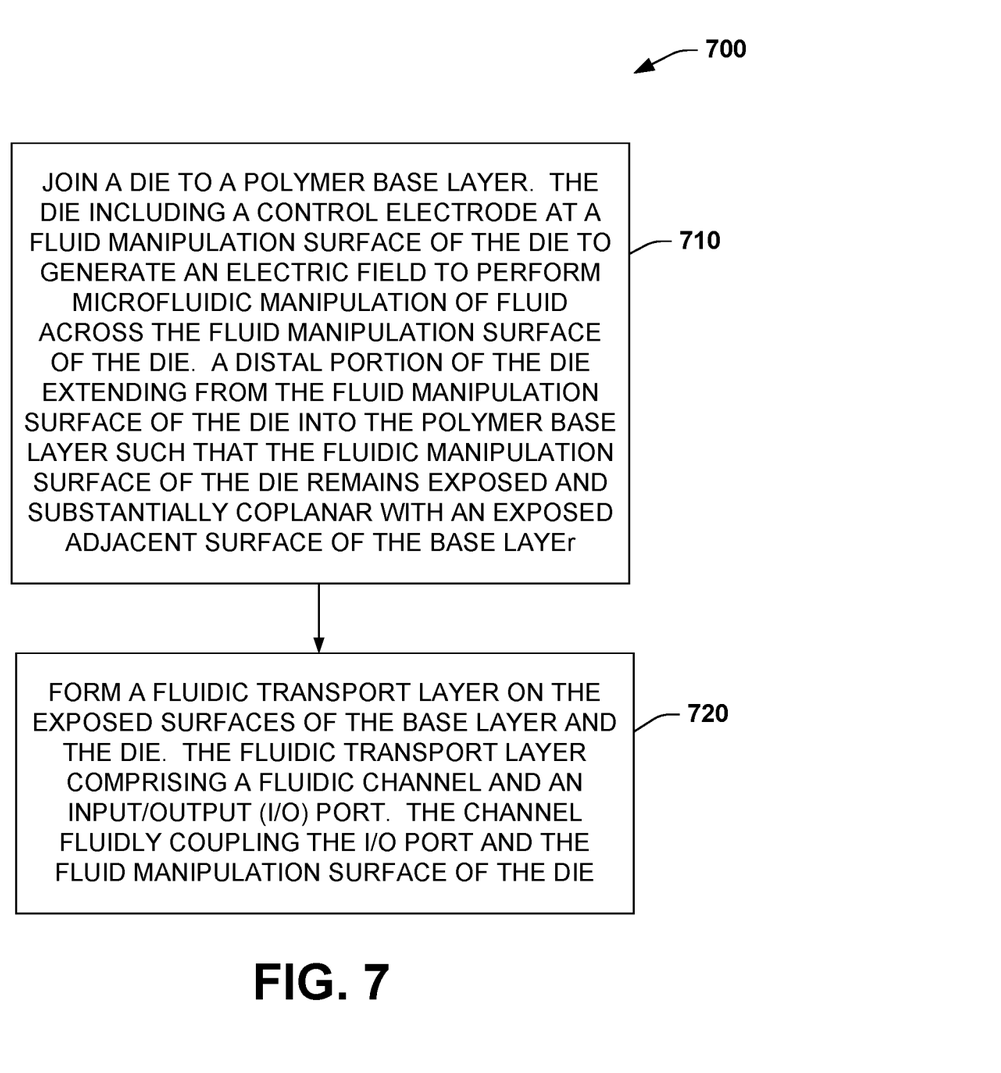
FIG. 7 illustrates an example fabrication method for a fluid manipulation assembly.
Figure 8:
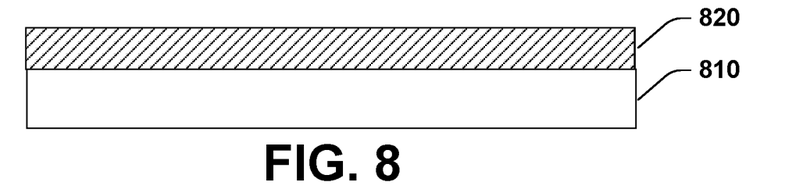
FIGS. 8 through 12 illustrate an example fabrication process to form an apparatus containing multiple die that can be installed as a coplanar assembly with a base player.
Figure 9:
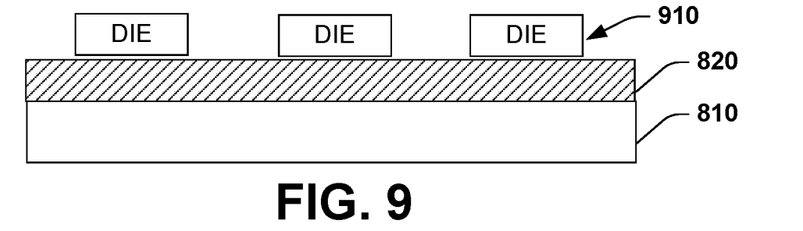

In view of the foregoing structural and functional features described above, an example method will be better appreciated with reference to FIG. 7. While, for purposes of simplicity of explanation, the method is shown and described as executing serially, it is to be understood and appreciated that the method is not limited by the illustrated order, as parts of the method could occur in different order and/or concurrently from that shown and described herein. Such method can be executed by various components configured as machine readable instructions stored in memory and executable in an IC or a processor, for example.

FIG. 7 illustrates an example fabrication method 700 for a fluid droplet manipulation assembly. At 710, the method 700 includes joining a die to a polymer base layer. The die includes a control electrode at a fluid manipulation surface of the die to generate an electric field to perform microfluidic manipulation of fluid across the fluid manipulation surface of the die. A distal portion of the die extends from the fluid manipulation surface of the die into the polymer base layer such that the fluid manipulation surface of the die remains exposed and substantially coplanar with an exposed adjacent surface of the base layer (see e.g., FIGS. 8-11). At 720, the method 700 includes forming a fluidic transport layer on the exposed surfaces of the base layer and the die. The fluidic transport layer includes a fluidic channel and an input/output (I/O) port (see e.g., FIG. 12). The channel fluidly couples the I/O port and the fluid manipulation surface of the die. Although not shown, with respect to joining the die, the method can include placing the die on a carrier layer and molding an Epoxy Molding Compound (EMC) on top of the die and the carrier layer to form the coplanar surface with the polymer base layer. In an alternative method such as depicted in FIG. 13, the die can be inserted into a recessed portion of the base layer to form a coplanar surface for fluid manipulation.

FIGS. 8 through 12 illustrate assembly fabrication process to form a die that can be molded to a base layer to provide a DMF apparatus as disclosed herein. In this example, the die and base layer can be formed of different material and the die and the base layer be integrated into a common package where their surfaces that are substantially coplanar. In this example, the die can be formed of a semiconductor material and base layer is formed of a relatively less expensive material (e.g., a polymer, such as EMC). To begin the coplanar fabrication process at FIG. 8, a temporary carrier 810 (e.g., ceramic) is provided having a tape lamination layer 820. At FIG. 9 of the coplanar process, one or more dies 910 are attached to the tape lamination layer 820. The dies 910 can be placed via a pick and place integrated circuit placement process, for example.

Figure 10:
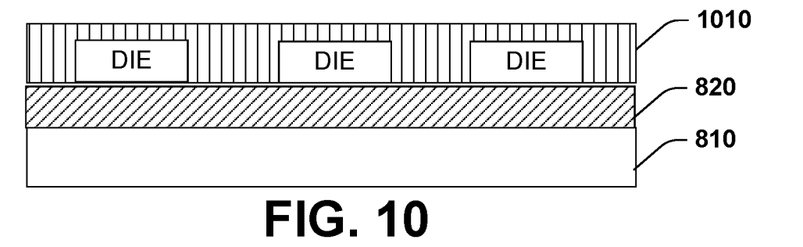
Figure 11:
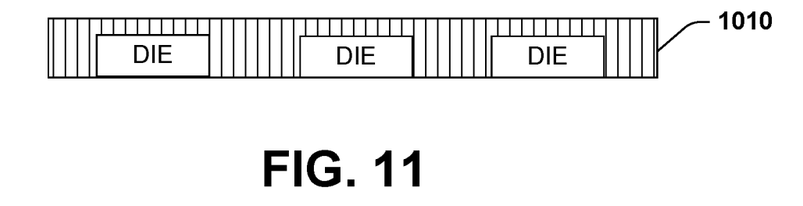
Figure 12:
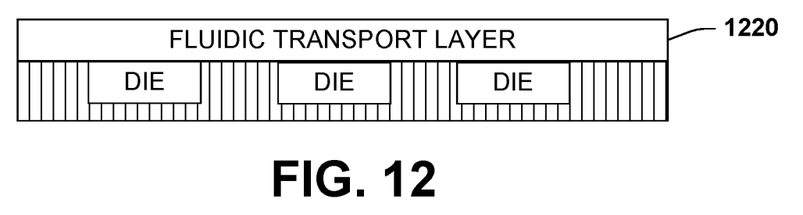

Proceeding to FIG. 10 of the coplanar fabrication process, a base layer at 1010 can be molded over the dies. The base layer 1010 can include a liquid molding compound, such as an EMC, for example. Proceeding to FIG. 11 of the coplanar fabrication process, carrier 810 and tape layer 820, are removed (e.g., de-bonded via heat treatment) after the base layer 1010 has been formed and cured. Proceeding to FIG. 12, a fluidic transport layer 1220 can be attached to the base layer and die assembly of FIG. 11. Although a molding processes is shown FIGS. 8-12 where co-planarity is provided between the die and base layer, an alternative coplanar fabrication process is depicted in FIG. 13 where the die is fitted into a preexisting recessed portion of the base layer.

Figure 13:
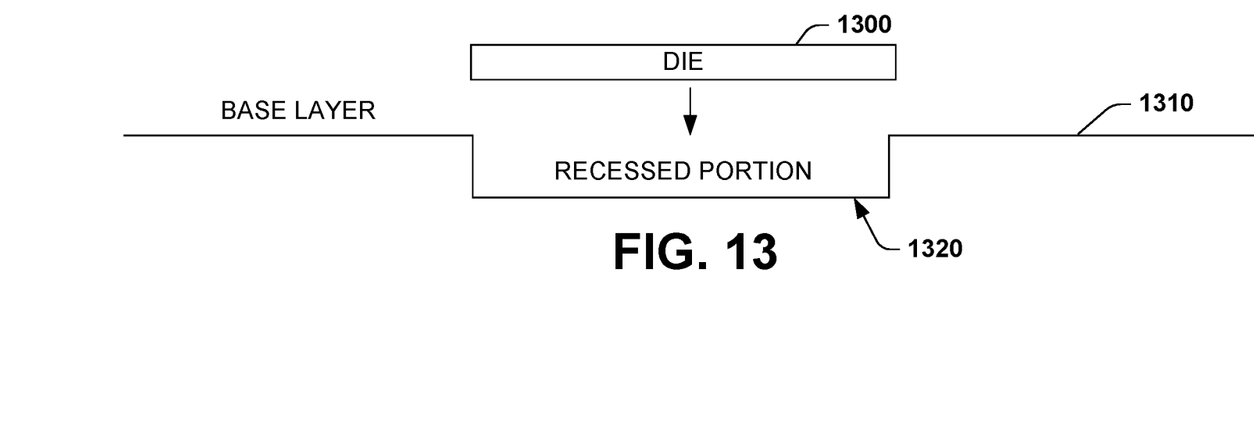
FIG. 13 illustrates an alternative coplanar assembly process between a die and a base layer.

FIG. 13 illustrates an alternative coplanar assembly process between a die 1300 and a base layer 1310. As shown, the base layer includes a recessed portion 1320 where the die 1300 can be installed. The die 1300 can be assembled into a pre-formed pocket or recessed portion 1320 in the base layer 1310, where the die should be sufficiently planar, and no appreciable gap should exist between the die edge and the base layer edge. To achieve this in one example, a small amount of adhesive can be stamped into the recessed portion 1320 (or needle dispensed around the perimeter of the recessed portion). The amount of adhesive can be tuned to ensure a slightly proud adhesive, or nearly flush. After the die 1300 is placed into the recessed portion 1320, a film that is designed to not stick to the adhesive during cure such as Teflon coated films can be used to "planarize" the perimeter where the die edge meets the base layer 1310 during cure. Subsequently this films can be peeled off, leaving a sufficiently co-planar and no appreciable gap between the die 1300 and the base layer 1310. Another example approach can be to use the channel layer itself as a planarizing film to mitigate this gap. In this case, if there is a small step at the edge of the die 1300, a thick film (e.g., 2-4 um) of polymer material may be used to fill in this small gap (e.g., <10 um), and attempt to planarize between the die and base layer.

What have been described above are examples. One of ordinary skill in the art will recognize that many further combinations and permutations are possible. Accordingly, this disclosure is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. An apparatus, comprising
a polymer base layer having a surface; and
an integrated die having a fluid manipulation surface that is substantially coplanar with the surface of the polymer base layer, wherein no impediment to fluid flow is present at a juncture between the surface of the polymer base layer and the integrated die, and from an interconnect formed between an input/output port and the die, and wherein the polymer base layer and the integrated die form a coplanar fluid manipulation surface, and wherein the integrated die includes a control electrode configured to generate an electric field to perform microfluidic manipulation of fluid across the coplanar fluid manipulation surface of the integrated die and the polymer base; and a reagent storage package directly coupled to the polymer base layer, wherein the reagent storage package is configured to release a reagent therefrom.

2. The apparatus of claim 1, wherein the polymer base layer comprises an Epoxy Molding Compound (EMC).

3. The apparatus of claim 1, further comprising a fluidic transport layer disposed on the surface of the polymer base layer, the fluidic transport layer includes a fluidic channel to couple fluid from an input/output (I/O) port to the fluid manipulation surface of the integrated die.

4. The apparatus of claim 3, wherein the fluidic transport layer is coated with an electrically conductive layer to provide a return path for the control electrode to perform manipulation of fluid across the fluid manipulation surface of the integrated die.

5. The apparatus of claim 3, wherein the fluidic transport layer includes a mixing area to enable premixing of fluids before the fluids are injected into the I/O port.

6. The apparatus of claim 5, wherein the fluidic transport layer includes a reagent port to receive a reagent fluid to be mixed with fluid in the mixing area or to be mixed with fluid in the fluidic channel.

7. The apparatus of claim 6, wherein the a reagent storage package is fluidly connected with the reagent port to dispense at least a portion of the volume of the reagent fluid from the reagent storage package to the reagent port of the fluidic transport layer.

8. The apparatus of claim 3, further comprising a printed circuit assembly (PCA) having a connector that is mounted on a surface of the fluidic transport layer that is opposite the polymer base layer, the PCA electrically connects the control electrode from the connector to the integrated die.

9. The apparatus of claim 1, wherein the integrated die includes side edges that extend longitudinally between spaced ends of the integrated die, each side edge at the fluid manipulation surface of the integrated die contact and are coplanar with each adjacent edge of the polymer base layer.

10. An apparatus, comprising:
a polymer base layer having a surface;
an integrated die having a fluid manipulation surface that is substantially coplanar with a surface of the polymer base layer, wherein no impediment to fluid flow is present at a juncture between the polymer base layer and the integrated die, and from an interconnect formed between an input/output port and the die, and wherein the polymer base layer and the integrated die form a coplanar fluid manipulation surface, and wherein the integrated die includes a control electrode configured to generate an electric field to perform manipulation of fluid across the coplanar fluid manipulation surface of the polymer base layer and the integrated die; and
a fluidic transport layer supported by the polymer base layer and comprising a fluidic channel fluidly coupled with a fluidic input/output (I/O) port, the fluidic channel extends longitudinally across the fluidic transport layer from the die to the I/O port to space the I/O port apart from the fluid manipulation surface of the die; and
a reagent storage package coupled to a reagent layer, wherein the reagent layer is coupled to the polymer base layer, and wherein the reagent storage package is configured to release a reagent therefrom.

11. The apparatus of claim 10, wherein the fluidic transport layer is coated with a conductive layer to provide a return path for the control electrode to generate the electric field and to perform manipulation of fluid across the fluid droplet manipulation surface of the integrated die.

12. The apparatus of claim 10, wherein the integrated die includes side edges that extend longitudinally between spaced ends of the integrated die, each side edge at the fluid manipulation surface of the integrated die contact and are coplanar with each adjacent edge of the polymer base layer.

13. A method, comprising:
joining an integrated die to a polymer base layer, the integrated die including a control electrode at a fluid manipulation surface of the integrated die to generate an electric field to perform microfluidic manipulation of fluid across the fluid manipulation surface of the integrated die, a distal portion of the integrated die extending from the fluid manipulation surface of the integrated die into the polymer base layer such that the fluid manipulation surface of the integrated die remains exposed and substantially coplanar with an exposed adjacent surface of the polymer base layer, wherein no impediment to fluid flow is present at a juncture between the polymer base layer and the integrated die, and from an interconnect formed between an input/output port and the die, and wherein the polymer base layer and the integrated die form a coplanar fluid manipulation surface; and
forming a fluidic transport layer on a portion of the exposed surfaces of the polymer base layer and the integrated die, the fluidic transport layer comprising a fluidic channel and an input/output (I/O) port, the fluidic channel fluidly coupling the I/O port and the fluid manipulation surface of the integrated die.

14. The system of claim 13, wherein joining the integrated die includes placing the integrated die on a carrier layer and molding an Epoxy Molding Compound (EMC) on top of the die and the carrier layer to form the coplanar surface with the polymer base layer.

* * * * *